United States Patent
Lam

(10) Patent No.: US 8,487,424 B2
(45) Date of Patent: Jul. 16, 2013

(54) ROUTABLE ARRAY METAL INTEGRATED CIRCUIT PACKAGE FABRICATED USING PARTIAL ETCHING PROCESS

(75) Inventor: Ken Lam, Colorado Springs, CO (US)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 13/426,100

(22) Filed: Mar. 21, 2012

(65) Prior Publication Data

US 2012/0178214 A1    Jul. 12, 2012

Related U.S. Application Data

(63) Continuation of application No. 12/848,065, filed on Jul. 30, 2010.

(51) Int. Cl.
*H01L 23/52*    (2006.01)

(52) U.S. Cl.
USPC ........... 257/692; 257/700; 257/738; 257/741; 257/784; 257/676; 257/677; 257/E23.023; 257/E23.024; 257/E23.069; 257/E21.509; 438/118; 438/123; 438/124; 438/584

(58) Field of Classification Search
USPC ................. 438/118, 123, 124, 584; 257/692, 257/700, 738, 741, 784, 676, 677, E23.023, 257/E23.024, E23.069, E21.509
See application file for complete search history.

(56) References Cited

U.S. PATENT DOCUMENTS

| | | | |
|---|---|---|---|
| 5,830,800 A | 11/1998 | Lin | |
| 6,001,671 A | 12/1999 | Fjelstad | |
| 6,238,952 B1 | 5/2001 | Lin | |
| 6,635,957 B2 | 10/2003 | Kwan et al. | |
| 6,975,022 B2 | 12/2005 | Sakamoto et al. | |
| 7,245,023 B1 | 7/2007 | Lin | |
| 7,626,253 B2 | 12/2009 | Onodera et al. | |
| 2002/0027289 A1 * | 3/2002 | Kurihara et al. | 257/765 |
| 2002/0041019 A1 | 4/2002 | Gang | |
| 2006/0163702 A1 | 7/2006 | Kim et al. | |
| 2007/0108583 A1 | 5/2007 | Shim et al. | |
| 2008/0093597 A1 | 4/2008 | Kiyota | |
| 2009/0108423 A1 | 4/2009 | Riedl et al. | |
| 2009/0163702 A1 | 6/2009 | Khvorova et al. | |
| 2010/0224971 A1 | 9/2010 | Li | |

OTHER PUBLICATIONS

U.S. Office Action issued in U.S. Appl. No. 12/848,065 on Jul. 24, 2012, 15 pages.

(Continued)

*Primary Examiner* — Tu-Tu Ho
(74) *Attorney, Agent, or Firm* — Fish & Richardson P.C.

(57) ABSTRACT

An integrated circuit assembly is fabricated on a metal substrate strip in an array format that has raised circuitry pattern formed by photolithographic and metal etching processes. The circuitry pattern is formed on one side of the metal substrate only. The raised circuitry's etch depth extends partially through the metal substrate. Die attachment can be performed using a non-conductive material applied directly onto and around the raised circuitry features directly under the die. After wirebond and molding processes, the molded metal substrate strip assembly is processed through a metal etching process to remove the metal substrate portion that is exposed beyond the mold cap. A solder mask coating can be applied to protect the metal circuitry and to define the package pad opening to form Land-Grid-Array (LGA) packages. Solder balls can also be attached to form Ball-Grid-Array (BGA) packages.

6 Claims, 9 Drawing Sheets

OTHER PUBLICATIONS

International Application No. PCT/US2010/026394, Search Report and Written Opinion mailed May 7, 2010, 16 pages.

U.S. Office Action issued in U.S. Appl. No. 12/399,200 on Feb. 2, 2012, 11 pages.

U.S. Office Action issued in U.S. Appl. No. 12/399,200 on Jul. 3, 2012, 15 pages.

International Preliminary Report on Patentability issued in PCT/US2010/026394, 11 pages.

U.S. Office Action issued in U.S. Appl. No. 12/399,200 on Oct. 3, 2012, 16 pages.

Notice of Allowance issued in U.S. Appl. No. 12/848,065 on Nov. 19, 2012, 5 pages.

* cited by examiner

WIREBOND

OVER-MOLD

Cu ETCH

ROUTABLE ARRAY METAL INTEGRATED CIRCUIT PACKAGE FABRICATED USING PARTIAL ETCHING PROCESS

CROSS-REFERENCE TO RELATED APPLICATIONS

This application is a continuation of U.S. patent application Ser. No. 12/848,065, filed Jul. 30, 2010 entitled "Routable Array Metal Integrated Circuit Package Fabricated Using Partial Etching Process", the contents of which are incorporated herein by reference in its entirety.

TECHNICAL FIELD

The invention relates generally to integrated circuit packaging, and more specifically to a routable array metal integrated circuit package and process for making same.

BACKGROUND

Most electronic or computerized devices have electronic circuits that include one or more integrated circuits, often called "chips". These integrated circuits are usually relatively large or complex circuits such as computer processors, memory arrays, or other such devices. The actual circuits in the integrated circuit are typically formed using semiconductor devices formed on a substrate, such as doped silicon transistors, resistors, and capacitors formed on a silicon substrate.

The combination of a substrate and circuitry formed on the substrate is often referred to as a "die", and usually has circuitry that is so small that it is impossible to see the individual electronic components or circuit traces with the naked eye. Due to the small size of the circuit elements formed on the substrate, the die is also relatively fragile and can be easily damaged by scratching. Some circuits that operate at high power, such as high performance processors or controllers, also produce more heat than the integrated circuit die can dissipate, and so are not usable without some means of dissipating generated heat.

For these and other reasons, almost all integrated circuit dice are provided to the manufacturers of devices such as computers or cell phones in packages that are designed to protect the integrated circuit while making it easy to connect to other circuitry. Integrated circuit packages typically include pins, solder balls, or other electrical conductors that are coupled via small lead wires to various parts of the die's electrical circuits, enabling easy and reliable electrical connection from the package's exterior to the die's circuitry. These packages provide a variety functions not related to electrical connection, including carrying heat away from the die to the exterior of the circuit package and perhaps to an external heat sink, and protecting the relatively fragile die from environmental factors such as abrasion, moisture, and shock.

But, packaging an integrated circuit die has several challenges itself. Although a typical integrated circuit die is too small to form connections to without specialized equipment, it is still desirable to keep the size of the packaged die small so that it can be easily integrated into compact or portable electronic devices. The cost of the package is a significant concern, as complex packages that provide good heat management, good protection of the die, and easy connectivity to external circuitry can be a significant part of the cost of a packaged integrated circuit.

It is therefore desired to package integrated circuit dice in a manner that addresses such commercial needs.

SUMMARY

An integrated circuit assembly is fabricated on a metal substrate strip in an array format that has raised circuitry pattern formed by photolithographic and metal etching processes. At the end of the assembly process, a singulation process (e.g., sawing, laser cutting) is applied on the array strip to form individual packages.

The circuitry pattern is formed on one side of the metal substrate only. The raised circuitry's etch depth extends partially through the metal substrate. Die attachment can be performed using a non-conductive material applied directly onto and around the raised circuitry features directly under the die. After wirebond and molding processes, the molded metal substrate strip assembly is processed through a metal etching process to remove the metal substrate portion that is exposed beyond the mold cap. Since the metal circuitry portion is embedded inside the mold, only the exposed side will be slightly etched leaving the majority of the metal circuitry thickness intact. A solder mask coating can be applied to protect the metal circuitry and to define the package pad opening to form Land-Grid-Array (LGA) packages. Solder balls can be attached to form a Ball-Grid-Array (BGA) package.

In some implementations, a method of forming an integrated circuit assembly includes forming a routable metal layer on a sacrificial base layer. The forming includes: patterning the sacrificial base layer with etch-resist to define wire bond pad posts and external connection pad features; etching the patterned sacrificial base layer according to the patterning to form the wire bond pad posts and external connection pad features, where the etch depth is less than a thickness of the sacrificial base layer; stripping etch-resist from the wire bond pad posts; plating the wire bond pad posts with conductive material to form wire bond pads; applying an electrically nonconductive adhesive to the partially etched sacrificial base layer; attaching an integrated circuit die to the routable metal layer using the electrically nonconductive adhesive; attaching wire bond wires coupling circuitry on the die to the wire bond pads; encapsulating at least the die, wire bond pads and the wire bond wires in an electrically nonconductive protective overfill material; and removing the sacrificial base layer that is not encapsulated in the electrically nonconductive protective overfill material to expose the external connection pad features, thus providing external connection pads.

In some implementations, an integrated circuit assembly includes an integrated circuit die. A routable metal layer comprises metal traces formed in a sacrificial base layer linking a plurality of wire bond pads to a plurality of external connection pads. The metal traces are routable under the die area and the wire bond pads are formed on wire bond posts formed in the sacrificial base layer. An electrically nonconductive adhesive layer couples the integrated circuit die to the routable metal layer. A plurality of wire bonds link circuitry on the integrated circuit die to the wire bond pads in the routable metal layer.

The disclosed process allows very thin leadframe-base type packages to be fabricated, beyond the most advanced capability of conventional processes.

The disclosed process includes patterning etch on only one surface of the metal leadframe strip, while conventional processes require pattern etch on both surfaces of the metal leadframe strip.

The disclosed process provides routing capability to leadframe-base type packages by eliminating the die-attach paddle and replacing it with circuit routing traces and circuitry elements.

The disclosed process results in an integrated circuit assembly having a "bottom" side or second surface of a metal leadframe that is flat (free of extrusion features). This feature makes the assembly easy to handle through the assembly process, without requiring special-design work holders or jigs. By contrast, the "bottom side" or second surface of the metal leadframe of conventional integrated circuit assemblies typically includes circuitry features, such as package pads for second level assembly and also has a plating coating. This surface needs to make contact to equipment tracks and workholders during the assembly cycle and can easily incur mechanical damage and scratches resulting in localized package defects.

The metal substrate of the disclosed process remains "solid" throughout the assembly process (no etched-through or unsupported features). This minimizes handling damage and also facilitates wire bonding operations.

The disclosed process includes forming a solder mask layer for environmental and mechanical protection to the exposed metal traces at the "bottom" side of the assembly. The solder mask layer also defines pad openings for LGA and BGA packages.

BRIEF DESCRIPTION OF THE DRAWINGS

Like reference symbols in the various drawings indicate like elements.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention.

Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

The invention disclosed herein comprises in one example embodiment an integrated circuit assembly comprising an integrated circuit die, and a routable metal layer comprising metal traces linking a plurality of wire bond pads to a plurality of external connection pads such that the metal traces are routable under the die area. An electrically nonconductive adhesive layer couples the integrated circuit die to the routable metal layer, and a plurality of wire bonds link circuitry on the integrated circuit die to the wire bond pads in the routable metal layer. An overfill material encapsulates at least the integrated circuit die and the plurality of wire bonds, and one side of the package's external connection pads. In a further example, a plurality of solder balls are formed on the plurality of external connection pads.

Packaging for integrated circuits is typically designed to protect a relatively fragile integrated circuit die from its environment, to provide reliable electrical connection between the die and external circuitry, and in many cases to carry heat away from the die. Designing the packaging takes into consideration not only physical constraints such as these, but also the cost and complexity of the packaging process and the equipment required to package the dice.

One solution to packaging a die is illustrated in FIGS. 1A-1G, which show a sacrificial metal base strip packaging process. This example process starts by using a metal base strip onto which a package is formed, and from which the completed package is eventually separated.

Figure 1A:
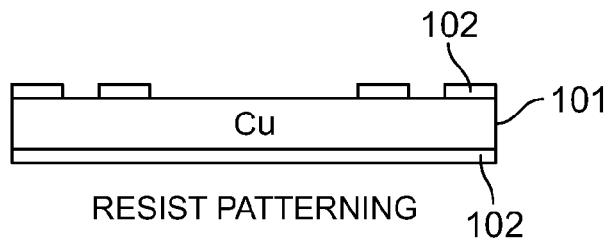
FIGS. 1A-1G show an example integrated circuit assembly fabricated using a sacrificial metal base substrate carrier, consistent with a prior art example.

In FIG. 1A, a copper base strip 101 has a plating resist pattern applied to the surface of the copper base strip, as shown at 102. The bottom side of the copper base strip also has an unpatterned, solid layer of plating resist coating to prevent any plating metal deposition onto the bottom surface. The resist pattern on the top side allows a plating step shown in FIG. 1B to deposit plating material in the patterned resist openings to form wire-bond metal pads 103 and die attach pad 104. In various embodiments, the plating material is one or more metal layers, such as gold, palladium, nickel, and copper. Palladium and gold work well for surfaces of metal layers to which wires will later be bonded, while metals such as nickel or copper are often used for the body of a plating step due to their high conductivity and relatively low cost. Gold is also resistant to oxidation, and so is often used for external plating of metal layers to prevent oxidation of the underlying solderable metal.

Figure 1B:
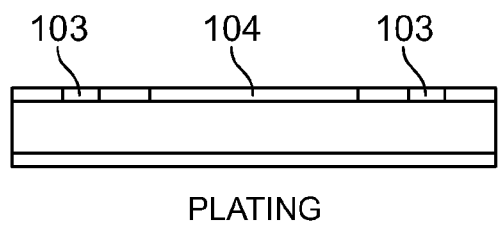
Figure 1C:
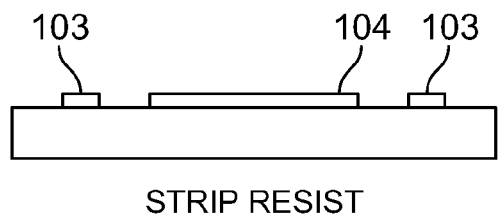
Figure 1D:
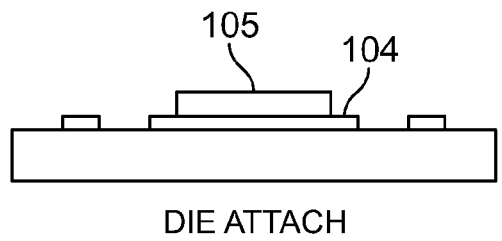

Once the metal plating process is completed, the resist material 102 applied in FIG. 1A is removed in FIG. 1C, leaving only the metal pads 103 and 104 formed in FIG. 1B on the copper strip 101. Here, region 104 forms a base for attachment of the integrated circuit die, as shown in FIG. 1D. The die 105 is attached to the metal plating region 104, such as by use of an epoxy or other adhesive.

Figure 1E:
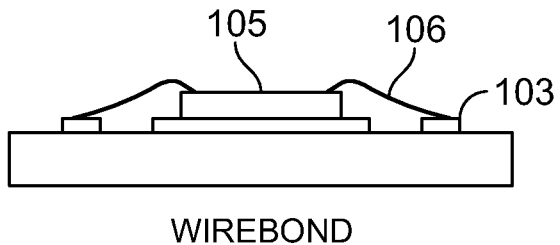

The various circuits on the integrated circuit die are then connected to metal pads 103 formed during the plating process by using fine wire in what is known as a wirebond process. As shown in FIG. 1E, the wires 106 connect various electrical contact points on the integrated circuit die to the metal pads 103, such that the metal pads 103 can be eventually coupled to electrical connections external to the completed package to couple the integrated circuit to external circuitry.

Figure 1F:
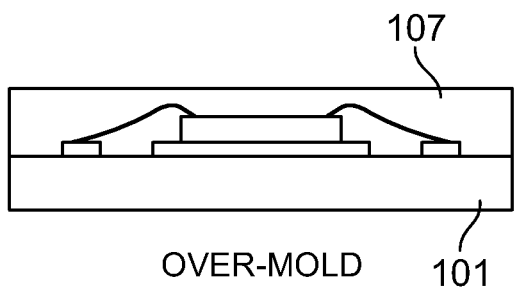

After the die is coupled via the wirebond wires to the metal pads formed in the plating process, the assembly is covered with an over-mold material as shown at 107 in FIG. 1F to encapsulate and protect the die and the wiring and metal pads. This over-mold material is an electrically nonconductive material, such as epoxy or another suitable material.

Figure 1G:
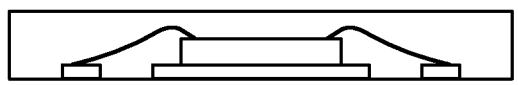

The encapsulated assembly is then processed to remove the sacrificial metal base strip 101 from the assembly, resulting in the die assembly shown in FIG. 1G. The copper base strip in this example is removed from the die assembly by a chemical etch that removes copper efficiently but does not attach to or react with the exposed metal used in the plated metal pads 103 and 104. The metal pads 103 and 104 in the assembly shown in FIG. 1G can then be coupled to the next level board assembly using solder or conductive adhesive compound, or through other means.

The metal pad 104 that supports the die is the same metal that is used to form the pads 103, but no metal pad formed in the plating process of FIG. 1B is connected to any other metal pad. The bond wires shown at 106 of FIG. 1E couple the die's circuits to the metal pads 103, enabling connection to external circuitry. Because the bond wires cannot cross one another without risking electrically coupling one wire to the other due to accidental contact, this packaging system does not provide the ability to cross or route wires to different pads.

One example embodiment of the invention addresses some problems with the assembly of FIG. 1 by providing a sacrificial metal base strip packaging process that includes a routable layer that is formed by pattern plating. This provides improved flexibility in routing circuit traces to facilitate external connections.

Figure 2A:
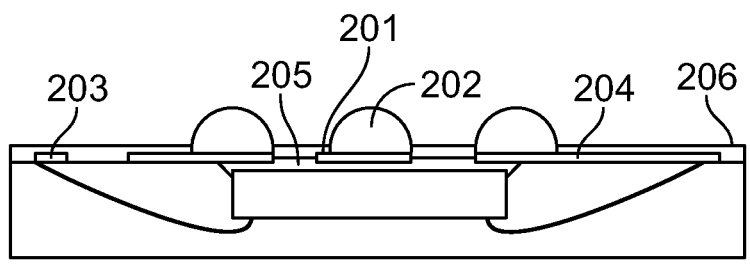
FIG. 2A shows a side view of an integrated circuit assembly having a routable metal layer, consistent with some embodiments of the invention.
Figure 2B:
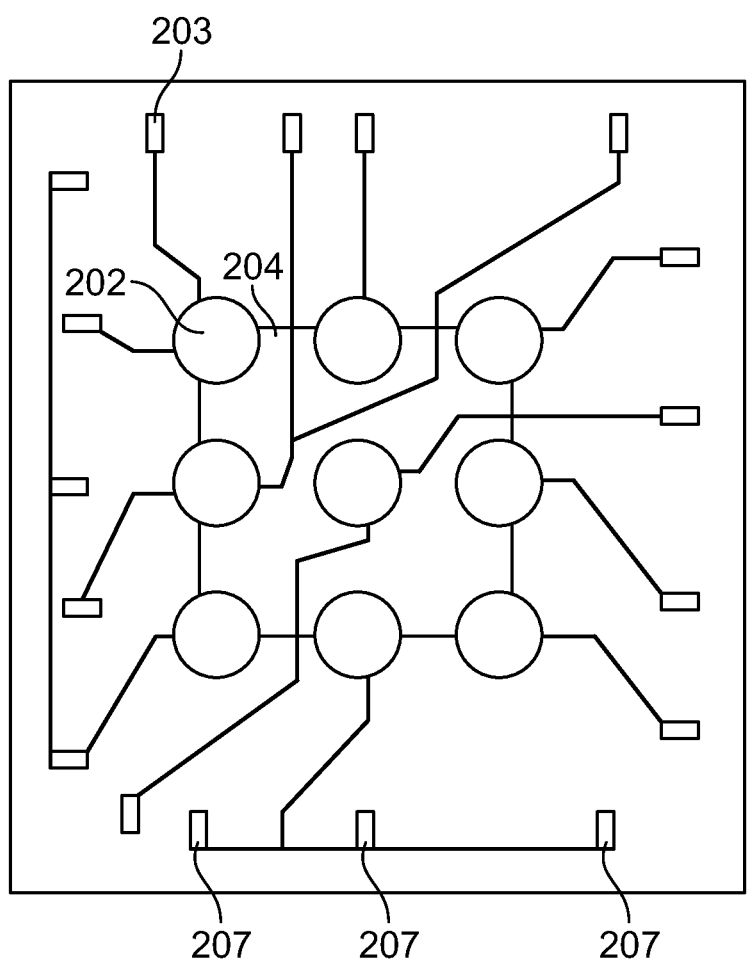
FIG. 2B is a bottom view of the integrated circuit assembly having a routable metal layer of FIG. 2A, consistent with an example embodiment of the invention.

FIGS. 2A and 2B show a pattern-plated sacrificial metal strip die package including a Ball Grid Array (BGA) format, consistent with an example embodiment of the invention. Other package formats without solder balls are also commonly used. In FIG. 2A, the die package is inverted from the example die package shown in FIG. 1G, and includes a routable metal layer in place of the large pad 104 onto which the die is mounted in FIG. 1.

Here, a routable metal layer of conductive traces 204 is formed on the sacrificial metal layer, including in the area in which the die is mounted. The traces are coupled to the die via wire bond connections to metal wirebond pads 203, which are coupled via the metal layer conductive traces 204 to package pads 201. Solder balls 202 are here formed on package pads 201 in openings in solder mask layer 206, for connection to external circuitry. To prevent the die, which is typically silicon material, from electrically shorting to the package pad metal 201 and metal traces 204, an electrically non-conductive die-attach adhesive material 205, such as epoxy compound, is used for die-attach. This provides a compact, efficient package, with enhanced flexibility in configuration due to the routable metal traces in the metal layer.

A bottom view of the example package of FIG. 2A is shown in FIG. 2B. Here, conductive traces 204 are shown to link various solder balls 202 to various metal wirebond pads 203, such that a wirebond connection from the die to the wirebond pad 203 is electrically coupled via conductive traces 204 to the solder balls 202. Some solder balls, such as power and ground connections, may be connected to multiple pads on the routable metal layer so that multiple power and ground connections can be made between the various circuits on the die and the external power source. An example is shown in FIG. 2B at pads 207, which are coupled to one another and to a single solder ball via metal traces on the routable metal layer.

Figure 3A:
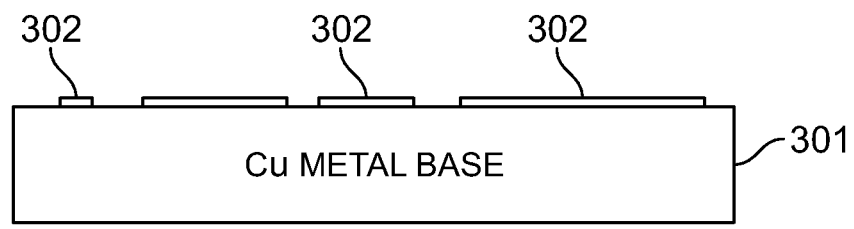
FIGS. 3A-3F illustrate an example method of forming an integrated circuit assembly having a routable metal layer using a sacrificial base layer and localized solder stop, consistent with an example embodiment of the invention.

FIGS. 3A-3F illustrate a method of forming a die package having a routable metal layer using a sacrificial metal strip integrated circuit packaging process, consistent with an example embodiment of the invention. In FIG. 3A, the sacrificial metal strip is a copper metal base 301, and a routable or patterned metal circuit layer 302 is formed on the strip, such as by using a photo-definable plating resist material and photo-mask as described in greater detail with respect to the example of FIG. 1. The metal layer here has one or more layers of metal in a metal-stack, where different types of metal may be used in different layers to provide different properties.

For example, the metal routable layer 302, which comprises wirebonding pad features 203, package pad features 201, and routing trace features 204 as illustrated in FIGS. 2A and 2B, includes in one embodiment a wire-bondable metal on the top surface, such as palladium, silver, or gold. A diffusion barrier metal layer such as nickel is immediately below the wire-bondable metal layer, and a conductive metal such as copper is next. Below that a solder diffusion barrier metal such as nickel is formed, and the bottom layer is an oxidation prevention metal such as silver, gold, or palladium. In alternate embodiments, more layers, other layers, or only select layers from the above example are included in the routable metal layer 302.

Figure 3B:
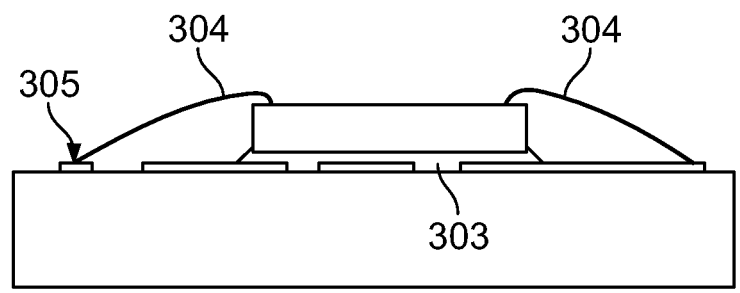

The die is attached to the routable metal layer in FIG. 3B via an electrically nonconductive epoxy layer 303, or via another nonconductive adhesive material. The die is therefore not directly electrically connected to any routable metal traces routed under the die, but is instead coupled to the routable metal layer via bond wires 304. The bond wires 304 are attached to various pads 305, which are coupled via the routable metal layer to external circuit connections.

Figure 3C:
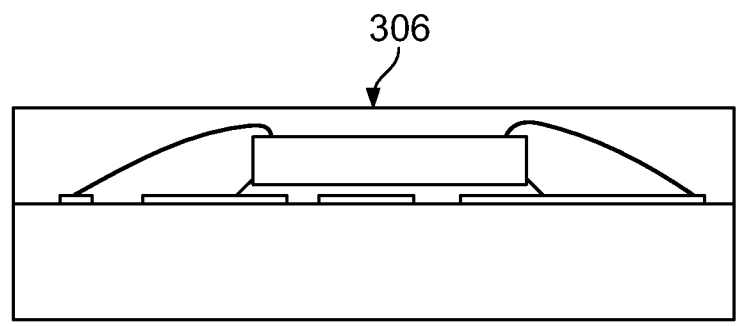
Figure 3D:
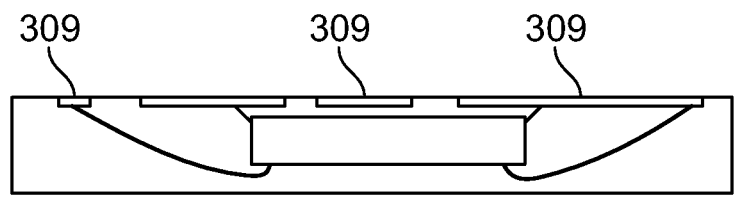

The assembly is then encased as shown in FIG. 3C with an overmold material 306, which protects the die and the bond wires from abrasion, moisture, and other environmental factors. The sacrificial metal strip copper base is then removed as shown in FIG. 3D (shown upside-down), such as by chemical etching. This leaves the routable metal layer and the die-attach epoxy exposed from the overmold applied in FIG. 3C. The sacrificial metal strip is in some examples a long or continuous metal strip that is cut into individual die packages near the end of the packaging process, such as by sawing the metal strip or the die package, as shown in FIG. 5.

Figure 3E:
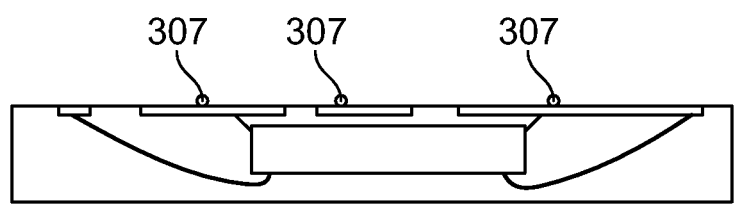

Solder balls are applied to the exposed solder ball regions 309 of the routable metal layer as shown in FIG. 3D. In FIG. 3E, solder stop 307 is applied at various points to constrain solder from flowing onto metal traces 204 during solder ball attachment to the pad areas as shown at 308 in FIG. 3F.

Figure 3F:
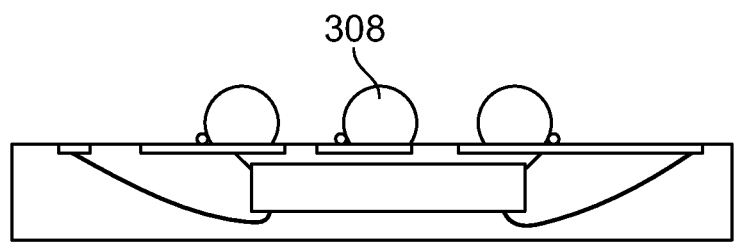
Figure 4A:
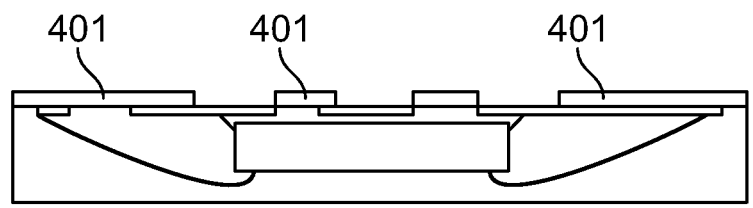
FIGS. 4A-4B illustrate an alternate method of forming an integrated circuit assembly having a routable metal layer using a sacrificial base layer using a full solder mask, consistent with an example embodiment of the invention.
Figure 4B:
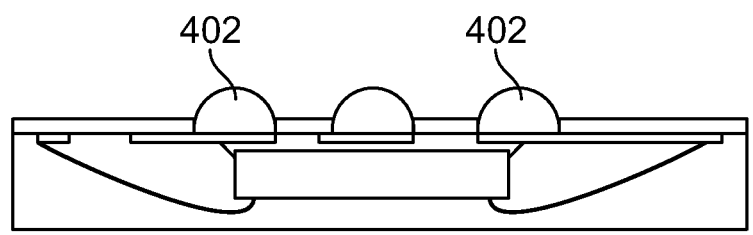

FIGS. 4A and 4B present an alternate method of applying solder balls, using a full solder mask layer instead of solder stop as employed in FIGS. 3E and 3F. In FIG. 4A, a permanent solder mask 401 is applied to the entire bottom side of the integrated circuit package except for the area over the package metal pads that will receive solder balls, as shown at 402 in FIG. 4B. This solder mask layer can be of a photo-definable or non-photo-definable characteristic, in ink or dry-film form, and can be applied using screening or lamination process in various embodiments.

Figure 5:
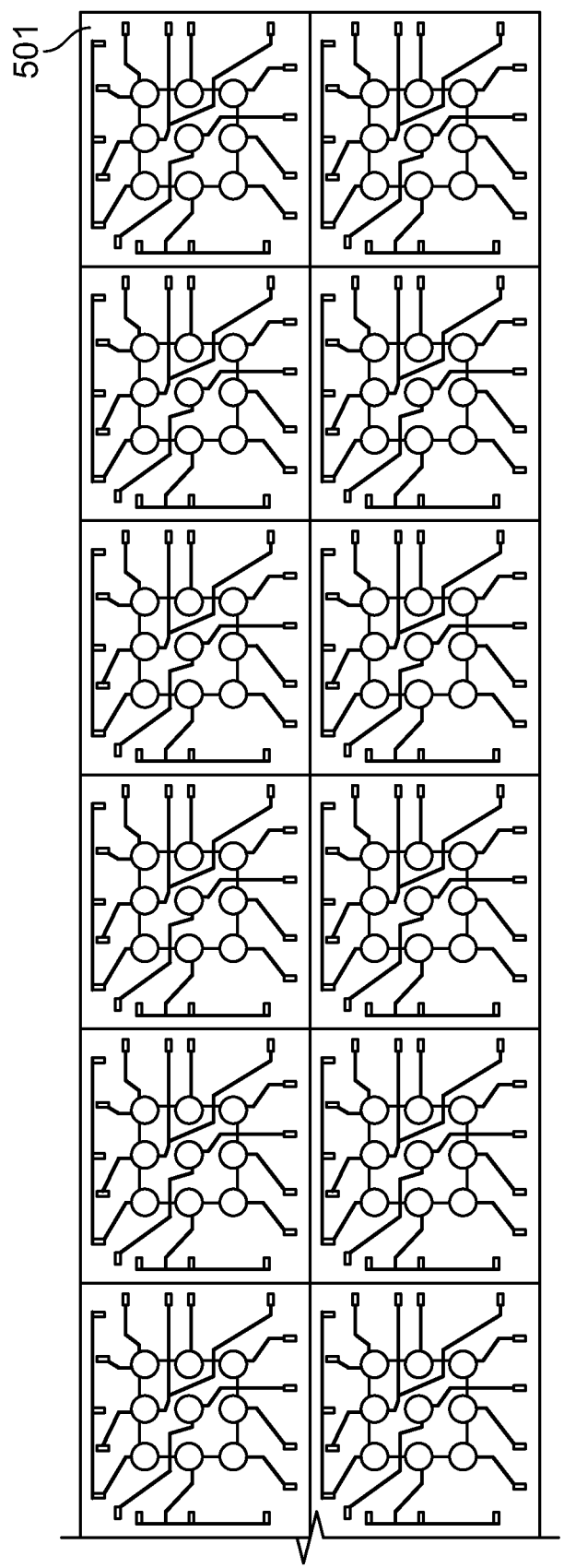
FIG. 5 is a top view of a series of integrated circuit assemblies formed on a sacrificial metal strip base layer, consistent with an example embodiment of the invention.

As previously discussed in the example presented in FIG. 3, a series of integrated circuit assemblies can be formed on a long or continuous sacrificial metal strip base layer, such as is shown in FIG. 5. The individual integrated circuit packages 501 are then separated from one another, such as by sawing, in the final stages of integrated circuit package production.

The routable metal layer integrated circuit assembly technology described herein therefore provides a variety of advantages over prior art integrated circuit mounting technologies such as the example illustrated in FIG. 1, including providing the advantage of full layer routing capability. A typical BGA package uses an organic substrate for routing. Eliminating an organic substrate in the routable metal layer integrated circuit examples illustrated in FIGS. 2-4 makes these examples significantly less expensive than prior technologies, and substantially reduces the height of the finished integrated circuit assembly which allows for thinner devices such as cell phones, personal digital assistant devices, global positioning systems, and other portable or handheld electronic devices.

Figure 6:
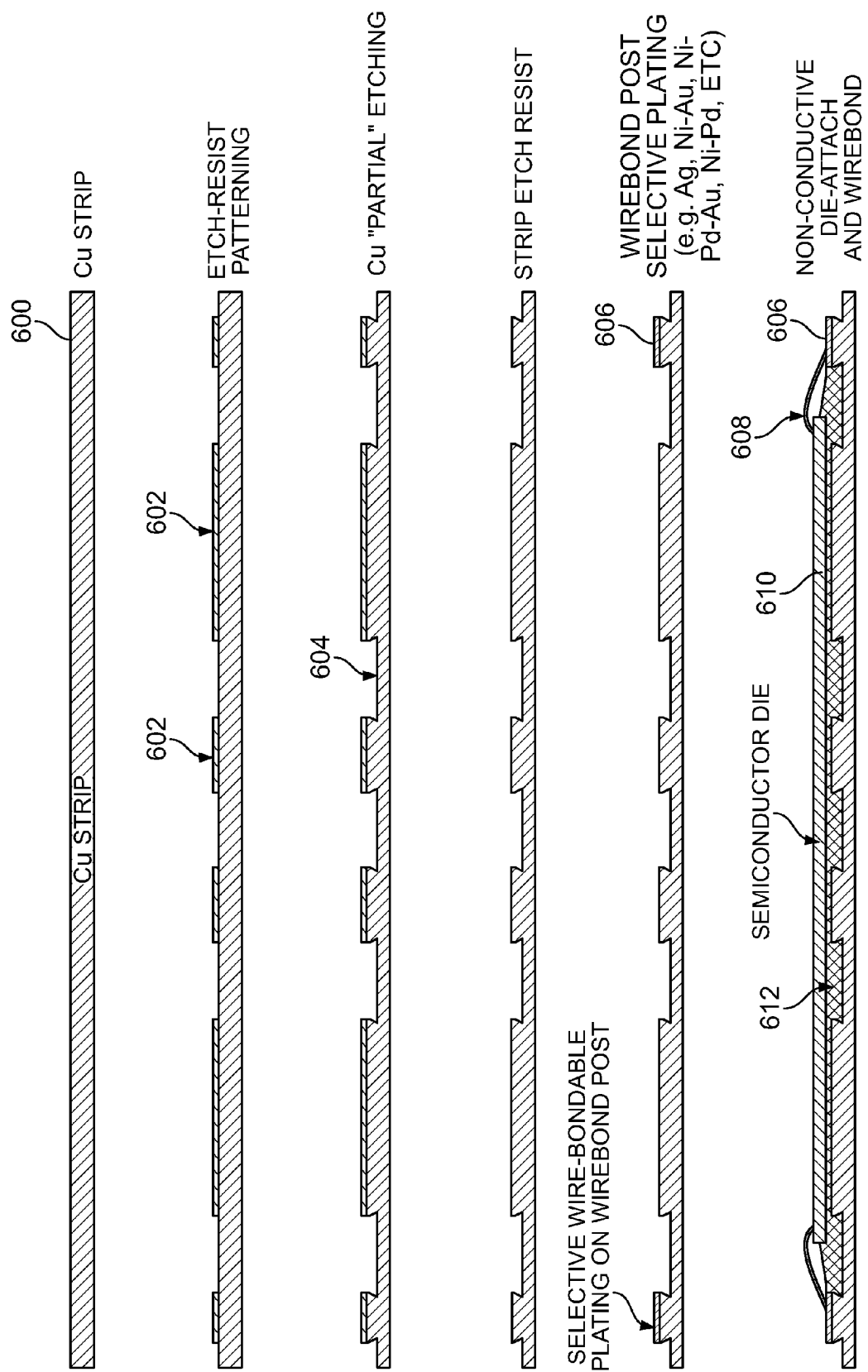
FIG. 6 is a cross-sectional view of an assembly process flow using a partial etching process.
Figure 6:
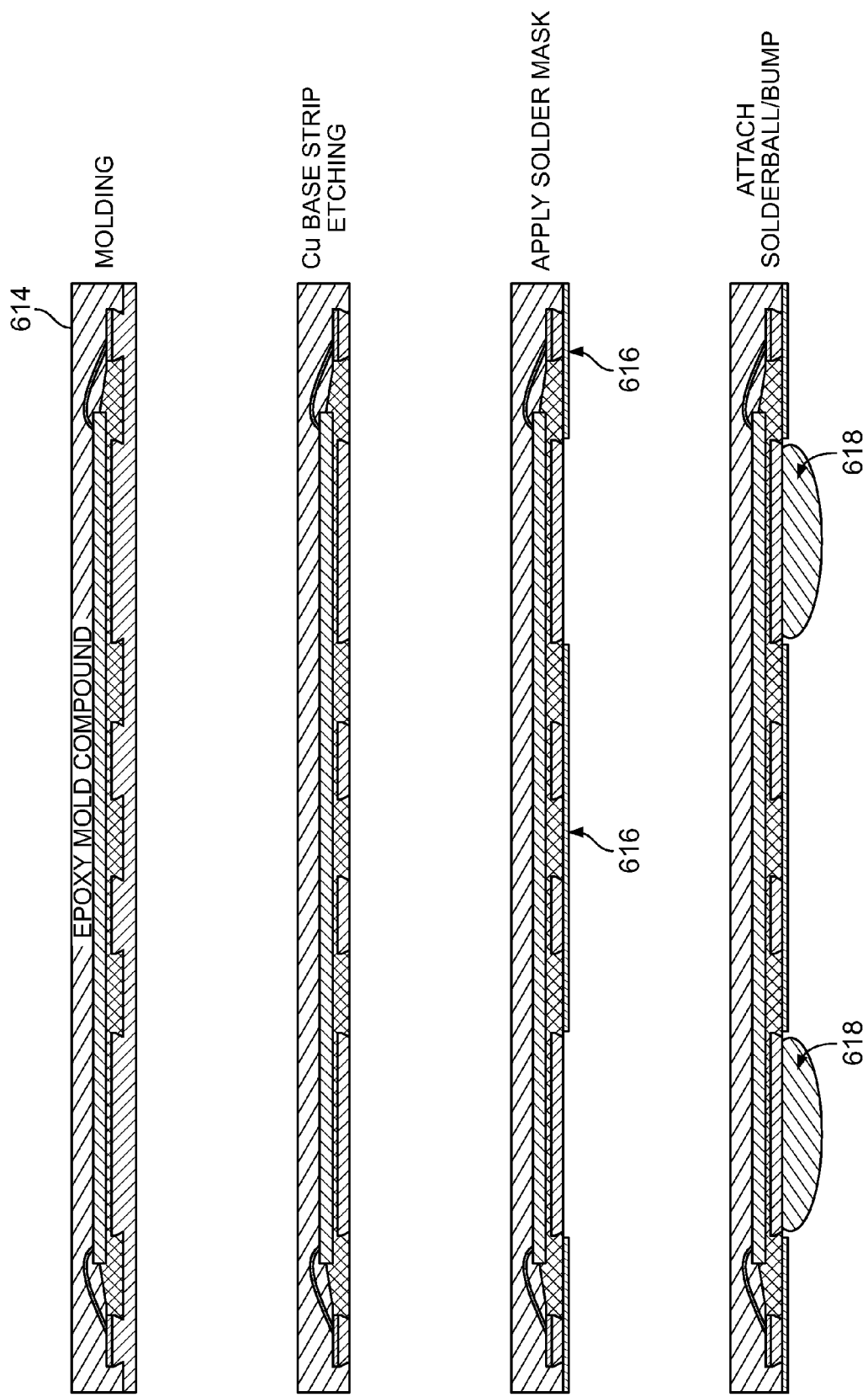

FIG. 6 is a cross sectional view of an assembly process flow using a partial etching process. The process can be used to assemble LGA and BGA packages that utilize a metal base strip onto which circuitry patterns can be formed by partial etching (not etched through) of the metal strip. The metal strip can include multiple individual package sites and can be singulated after assembly with sawing or laser cutting processes. LGA and BGA package circuitry element patterns can include package pads for second level assembly, circuit routing traces and wire bond pads. There is no die-attach paddle feature underneath the die. This die-attach paddle feature can be replaced with circuit routing traces and package pads for second level assembly. The die can be attached onto the circuit routing traces and package pads using an electrically non-conductive material (e.g., epoxy). In some implementations, the non-conductive die-attach material's bondline thickness can range from about 5 microns to about 50 microns.

Referring to FIG. 6, in some implementations, the assembly process flow begins with a metal sacrificial base layer 600, which can be made of copper (Cu). The sacrificial base layer 600 is patterned with etch-resist 602 to define circuit routing traces, wire bond pad posts and external connection pad features. The sacrificial base layer 600 is partially etched 604 according to the etch-resist pattern, creating the wire bond pad posts and external connection pad features. The etch depth is less than the thickness of the sacrificial base layer 600. After completion of the etching, the etch-resist is stripped from the sacrificial base layer 600.

Next, the wire bond pad posts are plated with conductive material (e.g., Ag, Ni—Au, Ni—Pd—Au, Ni—Pd, etc.) to form wire bond pads 606. In some implementations, the plating can be selectively applied to only the wire bond pad posts. In other implementations, the entire surface (including other circuit elements) can be plated. A non-conductive die-attach material 612 is disposed on the etched sacrificial base layer 600. Gaps between the circuit routing traces, wire bond pad posts and external connection pad features are filled with the nonconductive die-attach material 612. An integrated circuit die 610 is attached to the etched sacrificial base layer 600 using the nonconductive die-attach material 612. Conductive wire bond wires 608 (e.g., gold, copper or aluminum wires) are attached to the wire bond pads 606 and integrated circuit die 610.

Next, the die 610, wire bond pads 606 and wire bond wires 608 are encapsulated in an electrically nonconductive protective overfill material 614 (e.g., epoxy mold compound). The overfill material 614 extends to the etch depth. The surface of the sacrificial base layer 600 that is opposite the surface where the die 610 is attached is strip etched until the sacrificial base layer 600 is flush with the overfill material 614 and the wire bond pad posts and external connection pads are exposed.

A solder mask 616 is applied to the strip etched surface to partially cover the surface, including the exposed wire bond pad posts, but leaving only the external connection pads exposed. This forms an LGA package configuration. For BGA package configurations, solder balls or bumps 618 can be attached to the exposed external connection pads to complete the assembly. The assembly can be mounted to a circuit board using the solder balls or bumps 618. In some implementations, a single LGA or BGA package can include multiple IC dies.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

What is claimed is:

1. An integrated circuit assembly, comprising:
   an integrated circuit die mounted over a die area of a base layer, the die area having four sides;
   a routable metal layer comprising metal traces formed in the base layer, each metal trace routed under the die area and linking at least two wire bond pads through a package pad that is at least partially under the die area, where the at least two wire bond pads are located outside the die area and are proximate to different sides of the die area, where the wire bond pads are formed on wire bond posts formed in the base layer;
   an electrically nonconductive adhesive layer coupling the integrated circuit die to the routable metal layer; and
   a plurality of wire bonds linking circuitry on the integrated circuit die to the wire bond pads in the routable metal layer.

2. The integrated circuit assembly of claim 1, further comprising an overfill material encapsulating at least the integrated circuit die and the plurality of wire bonds.

3. The integrated circuit assembly of claim 1, wherein a solder ball is formed on the package pad.

4. The integrated circuit assembly of claim 1, wherein the die is adhesively attached to the routable metal layer in the die area.

5. The integrated circuit assembly of claim 4, wherein a material of an electrically nonconductive adhesive layer fills gaps between two or more traces routed in the routable metal layer under the die area.

6. The integrated circuit assembly of claim 1, wherein the routable metal layer comprises one or more layers of metal comprising at least one of gold, silver, palladium, nickel, and copper.

* * * * *